United States Patent
Ono et al.

(10) Patent No.: US 6,677,244 B2
(45) Date of Patent: Jan. 13, 2004

(54) SPECIMEN SURFACE PROCESSING METHOD

(75) Inventors: Tetsuo Ono, Iruma (JP); Yasuhiro Nishimori, Ohme (JP); Takashi Sato, Kudamatsu (JP); Naoyuki Kofuji, Tama (JP); Masaru Izawa, Hino (JP); Yasushi Goto, Kodaira (JP); Ken Yoshioka, Hikari (JP); Hideyuki Kazumi, Hitachi (JP); Tatsumi Mizutani, Koganei (JP); Tokuo Kure, Hinode-machi (JP); Masayuki Kojima, Kokubunji (JP); Takafumi Tokunaga, Iruma (JP); Motohiko Yoshigai, Hikari (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/135,516

(22) Filed: May 1, 2002

(65) Prior Publication Data

US 2002/0123229 A1 Sep. 5, 2002

Related U.S. Application Data

(63) Continuation of application No. 09/393,893, filed on Sep. 10, 1999, now Pat. No. 6,492,277.

(30) Foreign Application Priority Data

Sep. 10, 1998 (JP) .......................... 10-256926
Sep. 11, 1998 (JP) .......................... 10-258599

(51) Int. Cl.$^7$ .......................... H01L 21/302
(52) U.S. Cl. .................. 438/706; 438/714; 156/345
(58) Field of Search .................. 438/706–710, 438/714

(56) References Cited

U.S. PATENT DOCUMENTS

| | | | |
|---|---|---|---|
| 4,585,516 A | | 4/1986 | Corn et al. |
| 5,298,112 A | | 3/1994 | Hayasaka et al. |
| 5,376,211 A | | 12/1994 | Harada et al. |
| 5,494,522 A | * | 2/1996 | Moriya et al. ............... 118/719 |
| 5,593,539 A | | 1/1997 | Kubota et al. |
| 5,625,526 A | * | 4/1997 | Watanabe et al. ............ 361/234 |
| 5,779,925 A | * | 7/1998 | Hashimoto et al. ............ 216/67 |

* cited by examiner

Primary Examiner—Kin-Chan Chen
(74) Attorney, Agent, or Firm—Antonelli, Terry, Stout & Kraus, LLP

(57) ABSTRACT

A plasma processing method for etching a sample having a gate oxide film includes generating a plasma in a vacuum chamber using electromagnetic waves, applying an rf bias power to the sample, turning off the rf bias power before a charged voltage of the sample reaches a breakdown voltage, turning on the rf bias power after the charged voltage of the sample has substantially dropped, and repeating the turning on and off of the rf bias power to process the sample. The off-time is set at least longer than the on-time.

4 Claims, 12 Drawing Sheets

(1)  (2)  (3)

SPECIMEN SURFACE PROCESSING METHOD

CROSS REFERENCE TO RELATED APPLICATION

This is a continuation of U.S. application Ser. No. 09/393,893, filed Sep. 10, 1999, now U.S. Pat. No. 6,492,277 B1, the subject matter of which is incorporated by reference herein.

BACKGROUND OF THE INVENTION

The present invention relates to a method of processing the surface of a specimen and an apparatus capable of performing this method; and, in particular, the invention relates to a method and apparatus suitable for plasma-etching the surface of a specimen on which semiconductor elements and the like are to be formed.

An apparatus for etching semiconductor elements, for example, an apparatus employing a co-called ECR (Electron Cyclotron Resonance) system, will be explained. This ECR system generates a plasma by exciting an inert gas in a vacuum container to which microwave energy and a magnetic field have been applied from the outside. The magnetic field causes electrons to move with a cyclotronic motion. The cyclotron frequency and the microwave frequency in resonance produce an environment in which a plasma can be generated efficiently. To accelerate plasma particles (ions) and cause them travel fast enough before striking a target in their path, a high-frequency voltage is applied to the target. A halogen gas, such as chlorine gas or fluorine gas, is used for generation of a plasma gas.

A high-precision type surface treating apparatus is disclosed in Japanese Non-examined Patent Publication No. 06-151360 (1994). This patent publication discloses that the intermittent on/off control of a high-frequency voltage applied to the target increases the selectivity of a surface substance (silicone) to be etched from the ground (oxide film) of a target and makes the etching rate less independent of conductor patterns. Further, in Japanese Non-examined Patent Publication No. 62-154734 (1987), there is disclosed a method of intermittently turning on and off a high-frequency voltage and etching slanted areas with a high-depositing etching gas. Furthermore, in Japanese Non-examined Patent Publication No. 60-50923 (1985), there is disclosed a method of intermittently turning on and off a high-frequency voltage according to the supply quantity of an etching gas to increase the anisotropy. Furthermore, U.S. Pat. No. 4,585,516 discloses a 3-electrode etching apparatus and a method of intermittently turning on and off a high-frequency voltage across two of such electrodes to assure a uniform etching speed over the whole wafer.

SUMMARY OF THE INVENTION

Along with a recent trend toward finer patterning of semiconductor elements, a problem of damage of semiconductor devices caused by the plasma used in the processing thereof is becoming significant and has been drawing considerable attention. More specifically, a typical thickness of a gate oxide film of a metal oxide semiconductor (MOS) has become less than 6 nm in memory devices with the introduction of the 256 M device. In addition to the demand for a thinner gate oxide film, when the aspect ratio (a ratio of vertical to lateral directions) in the processing becomes greater, the electrical damage caused by a so-called electron shading phenomenon becomes substantial. With reference to FIGS. 24(1) and 24(2) of the accompanying drawings, this electron-shading phenomenon will be more particularly described. FIG. 24(1) is a cross-sectional view of a semiconductor wafer exposed to plasma within an etching apparatus. FIG. 24(2) is a plan view of a resist pattern on the wafer shown in FIG. 24(1) as seen from above. A device insulation oxide film 204 and a gate oxide film 203 are formed on a Si substrate 205, and then, on these films, a poly-Si layer 202 and a resist 201 are formed in a comb pattern. During plasma etching, electrons 206 and ions 207 are bombarded on the specimen. Ions 207, which are accelerated by a high frequency voltage applied to the specimen, impinge on the surface of the specimen directly in the vertical direction. Electrons 206, which have a small mass and therefore have random speed components impinge on the specimen in random directions. Therefore, for processing of the surface with a groove having a high aspect ratio, as shown in FIG. 24(1), although ions can reach the bottom of the groove 208, most of the electrons are captured on the side walls of the resist 201. Then, positive charges are accumulated in gate oxide film 203 via poly-Si layer 202, and when the amount of this charge exceeds a predetermined value, the gate oxide film 203 is caused to breakdown, thereby resulting in a device failure. This phenomenon that prevents electrons from being supplied to the bottom of a fine patterned groove due to a difference in the directivities of ions and electrons is called electron shading.

Further, as smaller semiconductor elements have been required, finer patterning and working of them has become essential. For example, recent semiconductor circuit patterns have lines and spaces (which are equivalent to wires and electrodes on semiconductor elements) of 0.3 microns or narrower. However, the conventional etching processes cannot satisfy such a fine patterning requirement. Necessarily, in the resulting product, the etched lines are wider than required and resulting patterns are undesirable. Further, the etching status is greatly affected by a difference between the speed of fine-line etching and the speed of wide-space etching and a difference in the shapes (shape micro loading) Furthermore, since the oxide film of a gate of a MOS (Metal Oxide Semiconductor) transistor (for memory chips of 256 MB or higher) is very thin (6 nm or less), its etching status is greatly affected by the anisotropy and the ratio of ground selectivity (ratio of selecting an oxide film as the ground) which are inversely-proportional to each other.

Therefore, an object of the present invention is to provide for a surface processing method and an apparatus, which can substantially reduce the damage to a semiconductor device caused by this electron shading.

Another object of the present invention is to provide a surface treating method and apparatus which can increase the anisotropy and the ratio of ground selectivity in fine pattern etching processes.

The one object of the invention can be accomplished by provision of a fine pattern etching processing method which is performed by applying a high frequency voltage to the specimen, and which is comprised of repeating the steps of: turning off the high frequency voltage applied to the specimen before a charged voltage of the pattern reaches an insulation breakdown voltage of the gate oxide film to which the pattern is connected; and turning on the high frequency voltage when the charged voltage of the pattern becomes sufficiently low.

The other object of the invention can be accomplished by carrying out a process of fine pattern etching using a surface treating apparatus comprising a vacuum chamber, a means for generating a plasma in said chamber, and a high-frequency power supply which applies a high-frequency voltage across a target wafer and a target table which holds a target wafer to be etched by the plasma; wherein the amplitude of the high-frequency voltage is increased to improve the wall-to-bottom perpendicularity in etching and the high-frequency power supply is controlled so as to be turned on and off intermittently.

BRIEF DESCRIPTION OF THE DRAWINGS

These and other objects, aspects and embodiments of the present invention will be described in more detail with reference to the following drawings, in which.

PREFERRED EMBODIMENTS OF THE INVENTION

[Embodiment 1]

With reference to FIG. 1 to FIG. 12, a first embodiment of the invention will be described in the following.

Figure 1:
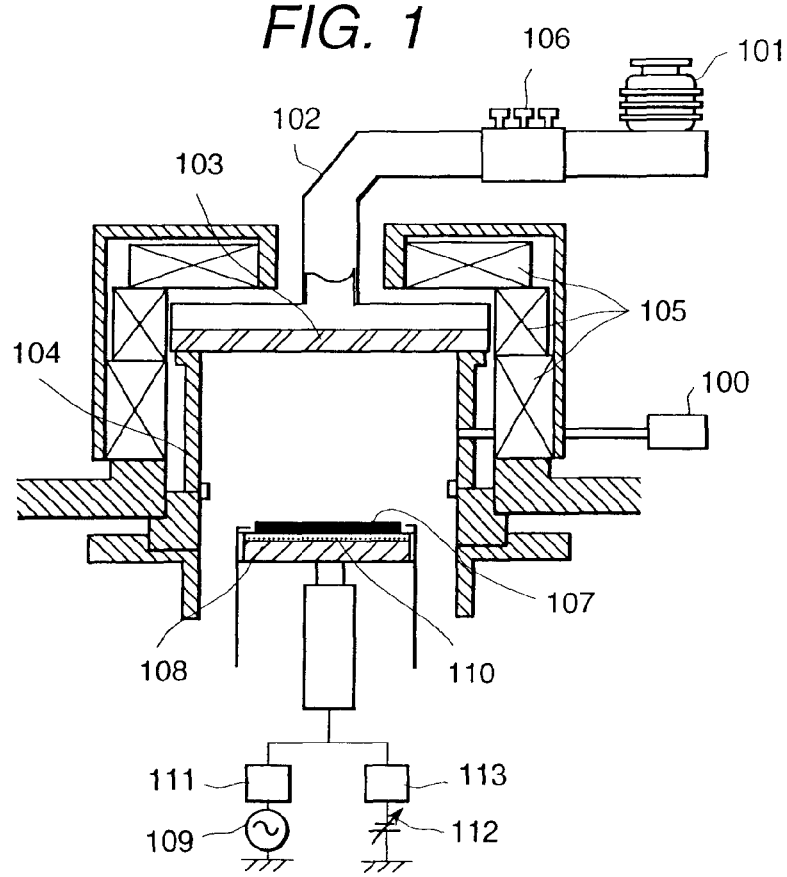
FIG. 1 is a diagram showing the overall etching apparatus according to an embodiment of the invention.

FIG. 1 is a diagram showing a plasma etcher to which the invention is applied. Microwaves are introduced from a magnetron 101 via an automatic matching apparatus 106, a waveguide 102, and a transparent window 103 into a chamber 104. Meanwhile, an etching gas, such as a halogen gas, is introduced into the chamber 104 via a gas introducing means 100, and a plasma of the gas is generated in the chamber 104 in association with the introduction of the microwaves. The transparent window 103 is made of a material, such as quartz and ceramics, which is able to transmit microwaves (electromagnetic waves).

Around the chamber 104, coils 105 are arranged. The magnetic flux density of the coils 105 is set so as to resonate with the frequency of the microwaves. For example, when the frequency is 2.45 GHz, the magnetic flux density is 875 Gauss. With the magnetic flux density, the cyclotron motion of electrons in the plasma resonates with the frequency of the electromagnetic waves, so that the energy of the microwaves is efficiently supplied to the plasma. Thus, a high density plasma can be produced.

A sample 107 is placed on a stage 108. In order to accelerate ions impinging on the sample 107, an rf (radio frequency) bias power supply 109 serving as an rf power supply is connected to the stage 108 via a high-pass filter 111. An insulating film 110, such as a ceramic or polymer film, is formed on the surface of the stage 108. A DC power supply 112 is also connected via a low-pass filter 113 to cause a voltage to be applied to the stage 108, thereby holding the sample on the stage by the action of an electrostatic chuck.

Figure 2:
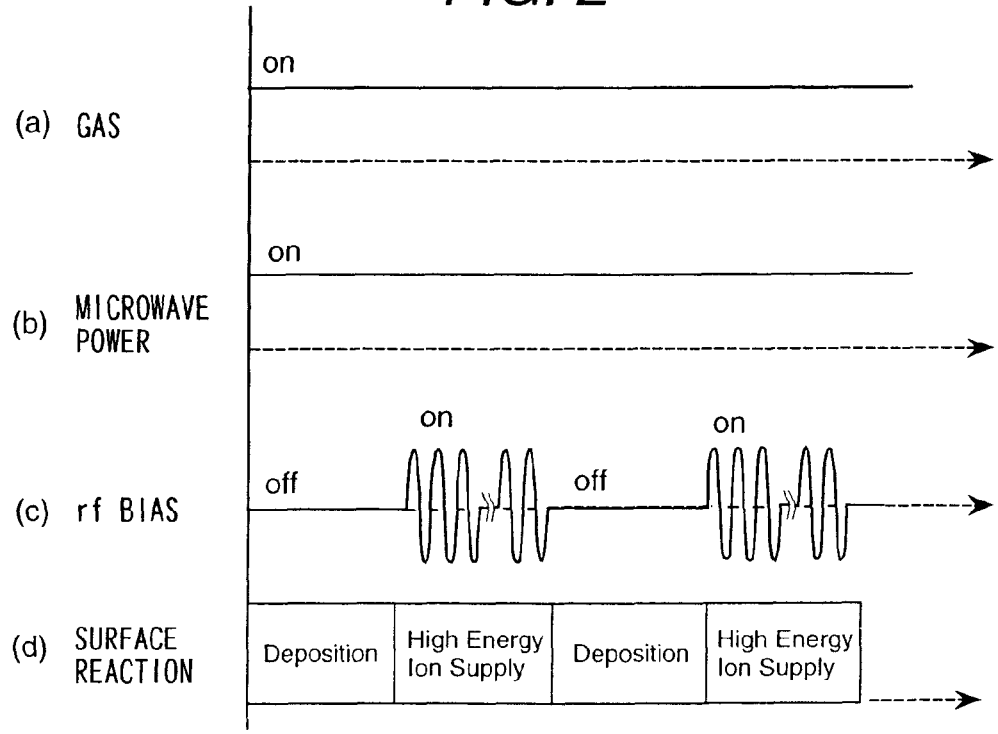
FIG. 2 is a timing chart showing the operation at the time of etching by the etching apparatus of FIG. 1.

FIG. 2 shows the turning of the gas supply in the chamber 104 and the operations of the magnetron 101 and the rf bias power supply 109 at the time of etching by the etcher of FIG. 1. As shown in line (a), a gas is supplied and the gas pressure is kept constant upon start of the etching. As shown in line (b), the microwave power is also continuously supplied. On the other hand, as shown in line (c), the rf bias applied to the sample is periodically on-off modulated. By generating ion accelerating periods and un-accelerated periods through on-off modulation of the rf bias, periods in which ion energy is high and periods in which the ion energy is low are produced during the time of the sample surface treatment. As shown in line (d), in the low energy ion period, the etching does not develop. Rather, reaction products in the gas or plasma are deposited.

The relation among the frequency of the rf bias, the on-off frequency, and the etching characteristic will now be described. When the rf bias is applied to the stage, a region (called a "sheath") of a high electric field is produced in the region of almost 1 mm or smaller in the thickness direction from the surface of the sample, and ions are accelerated in the sheath. The distribution of the energy of the accelerated ions depends on the rf bias frequency. When the rf bias frequency is sufficiently low, the motion of ions follows a change in the voltage expressed by a sine wave, so that the ions have the same energy as an instantaneous value Vx of the voltage. The energy distribution becomes very wide. When the frequency of the rf bias becomes high, the motion of the ions cannot follow the fluctuation in the rf bias. Consequently, the energy of the ions gradually converges on the value of a DC component Vdc of a voltage generated at the time of application of the rf bias. There is a transient state during the period. When the frequency lies in a range from about 100 kHz to few MHz, the energy of the ions has a saddle-shaped distribution including a peak of high energy corresponding to the amplitude Vpp of the rf bias and a peak of low energy. The peak of low energy corresponds to ions which enter the sheath when the rf bias is 0W, that is, just at a timing when the ions are not accelerated due to a fluctuation in the rf bias. The ions are not accelerated in the period during which the rf bias is off, and all of the ions enter a region corresponding to the low energy peak.

Figure 3:
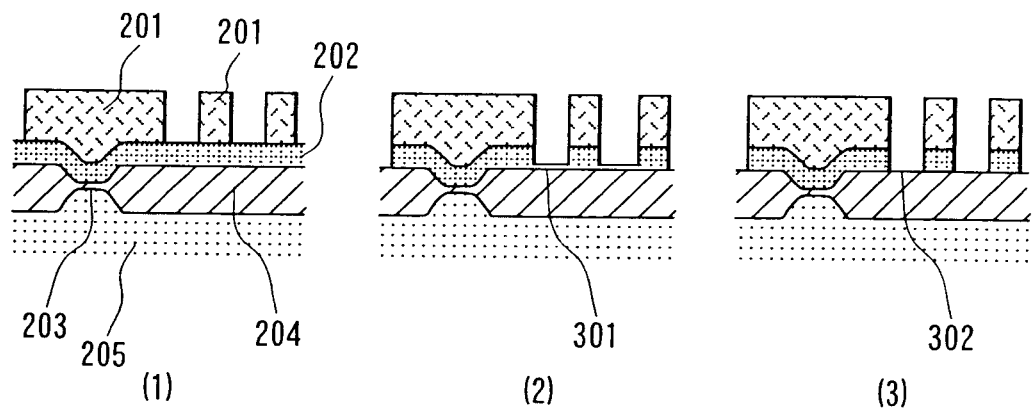
FIGS. 3(1)-(3) are cross-sections of a specimen, the surface of which is processed using the apparatus of FIG. 1.

FIGS. 3(1)-(3) shows how etching processes proceed for a fine patterned structure. FIG. 3(1) depicts an initial state prior to etching. FIG. 3(2) depicts an intermediate state where etching of poly Si in a broad area outside the lines is completed, but there still remains poly Si 301 between lines due to a so-called micro loading phenomenon which causes the etching speed in a fine pattern to decrease. At this time, the fine pattern is electrically isolated from the peripheral portion, thereby starting the charging of the pattern. Prior to this time, even if charging occurs due to electron shading, the charges can be dissipated through the poly Si in the peripheral portion.

FIG. 3(3) depicts a state where the etching further progresses, and an oxide film 302 of an underlayer between lines is exposed. At this time, when ions enter the bottom of the groove, the oxide film is charged because there is no more poly Si, however, the flow of charges to gate oxide film 203 is prevented, thereby minimizing degradation of the gate oxide film thereafter. That is, most of the breakdown of the gate oxide film occurs during transition from the state shown in FIG. 3(2) to the state shown in FIG. 3(3).

Figure 4:
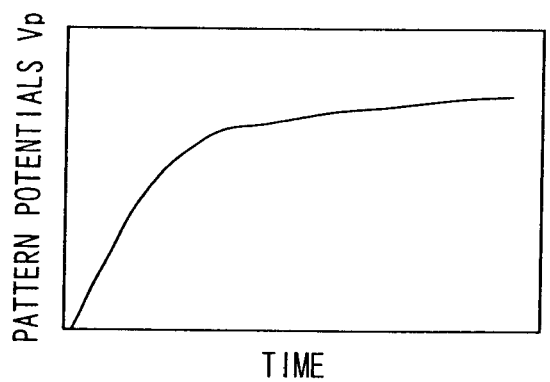
FIG. 4 is a graph showing a relationship between process times and pattern potentials.

FIG. 4 shows by way of computer simulation how pattern potentials of the lines and the space pattern increase after they are isolated from the peripheral portion. When the pattern potential increases and a current flows through the gate, and when a sum of charges Q that passes through the oxide film exceeds a breakdown charge quantity Qbd, the oxide film is destroyed.

Figure 5:
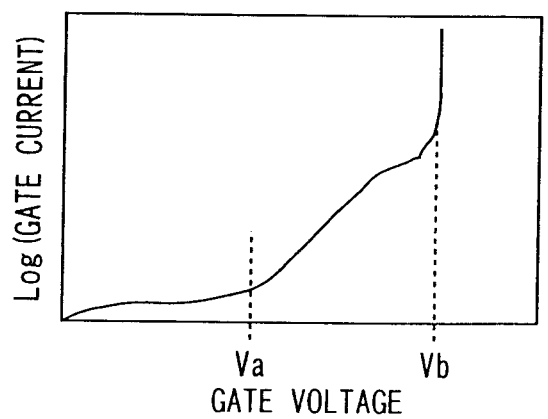
FIG. 5 is a graph showing a relationship between voltages and currents of the gate oxide film.

FIG. 5 shows a voltage-current characteristic curve of the gate oxide film. A so-called FN tunnel current starts to flow from the voltage Va in FIG. 5, and a large current flows at voltage Vb. Here, Vb is defined as a breakdown voltage. The increase in the pattern potentials in FIG. 4 is caused by acceleration of ions by application of the high frequency voltage to the specimen and by a resulting electron shading. In consideration of the above, in order to prevent the breakdown of the gate oxide film, it is considered effective to prevent a further increase in the pattern voltage by turning off the high frequency voltage before the pattern voltage Vp exceeds the breakdown voltage Vb. Because ions are no longer accelerated when the high frequency voltage is turned off, Vp is lowered. By repeating the steps of turning on the high frequency power supply again after Vp is lowered sufficiently, then turning the power supply off before it exceeds Vb, the quantity of charges able to flow through the gate oxide film can be maintained at a minimum, thereby preventing its breakdown.

Figure 6:
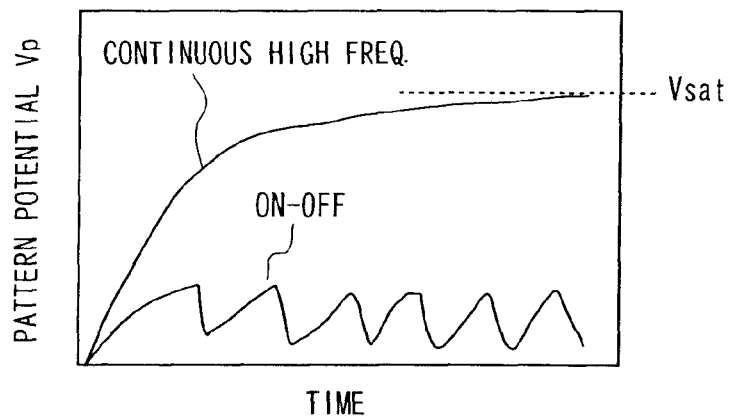
FIG. 6 is a graph showing a relationship between process times and pattern voltages.

FIG. 6 shows a change in the pattern potentials when the high frequency voltage applied to the specimen is turned on and off repeatedly. It is preferable for the sake of increased margin of safety to turn the high frequency power supply on and off such that Vp is suppressed to 50% or less of Vb.

Because the pattern is not charged indefinitely even if the high frequency voltage is continuously applied, the pattern voltage Vp becomes saturated at a saturation voltage Vsat at a point where the ions and electrons introduced are appropriately balanced. When Vsat is lower than the breakdown voltage Vb, the oxide film is prevented from being destroyed in a short period of time (in several tens ms). However, because of its current is somewhat large, the oxide film is likely to be destroyed after the elapse of a certain period of time. In this case, by repeating the steps of turning off the high frequency power before Vp reaches Vsat, and turning on the high frequency power after Vp becomes sufficiently lower, the breakdown of the oxide film can be suppressed. In order to further increase its safety margin, it is preferable to repeat the steps of turning the high frequency power on and off such that Vp is suppressed to 50% or less of Vsat.

The potentials of the pattern can be obtained by computer simulation or by connecting a probe to the pattern, however, these methods will take a substantial time. A simple method for obtaining an increase in the speed of the pattern voltage will be described in the following. In FIG. 3(2), the potentials at a portion outside the pattern and at the silicon substrate are normally equivalent. The line and space pattern in the semiconductor device correspond to a gate electrode and wiring interconnecting the gate, wherein the other portion of the line, except for a portion in contact with the gate oxide film, is disposed on a device insulation film or on an interlayer insulation film between multi-layered wirings.

The speed of increase of potential of a pattern on this insulation film corresponds to the speed of charging of a capacitance formed by the insulation film with an ion current from the plasma. However, a part of the ion current flowing to the poly Si layer which forms the line is neutralized by electrons on the side walls of the groove; therefore, 100% of the saturated plasma ion current density Is. That is not effective. However, its upper limit is given by Is. That is, a value obtained using Is shows the worst case, and thus this value can be used as a reference for preventing breakdown of the insulation. When a capacitor having a capacitance C (F/cm$^2$) per unit area is charged with a current I (A/cm$^2$) per unit area, the speed of increase of the voltage Vc (V/s) is given by Vc=I/C. The rise of the voltage in time Ton(s) is given by dV(V)=Vc×Ton. If Ton in the above equation which determines dV is set such that dV becomes smaller than the breakdown voltage Vb of the gate oxide film or Vsat of the saturation voltage of the pattern, the breakdown of the oxide film can be prevented. Further, in order to increase the margin for safety, it is preferable to set Ton such that pattern voltage Vp becomes 50% or less of Vb or Vsat.

The breakdown voltage Vb of the gate oxide film differs depending on the properties of the film. Also, the saturation voltage Vsat of the pattern depends on the shape of the pattern and the state of plasma. Conditions for suppressing breakdown of the gate oxide film to be established in the process of an oxide film of several nm thick will be described in the following. The strength of the electrical field needed to breakdown a thermal oxide film having such thickness is in a range from 6 to 12 MV/cm. The thickness of the gate oxide film of a typical element manufactured today is approximately 5 nm; therefore, if this value is taken as a reference, Vb becomes 3 to 6 V. Supposing that a line and space pattern to be etched are disposed on an insulation film of 100 nm thick, a capacitance C per unit area of the insulation film becomes $4 \times 10^{-8}$ F/cm$^2$.

Further, when the saturation ion current density Isat of the plasma during etching is set at 2 mA/cm$^2$, a voltage rise speed Vc=I/C at the line and space pattern becomes $0.5 \times 10^5$ V/s. In order to ensure that this voltage will not exceed the above-mentioned 3–6 V of the breakdown voltage Vb, it is preferred that a time Ton of the high frequency voltage to be applied to the specimen is set at 60 to 120 μs or less. This setting may depend on the quality of the oxide film, but for assurance of the safety margin, it is preferable that it be set at 50% or less of the above, namely, to set Ton at 30 to 60 μs or less. As should be apparent from the above description, the on-time period of the high frequency voltage for preventing breakdown of the gate oxide film is based on the thickness of the insulation film and the saturated ion current.

The on-time period of the high frequency voltage has been described heretofore. An off-time period thereof should be taken until the pattern potential drops sufficiently. Because the time constants for charging and discharging are approximately the same, the off-time period is preferably set to be at least longer than the on-time period. Namely, if a repetitive cycle of on and off switching is T, a ratio of the on-time period in one cycle is preferably set such that its duty ratio D becomes 50%. For improvement of the safety margin, it is sufficient for the off-time period to be set at a value more than twice that of the on-time period.

Figure 7:
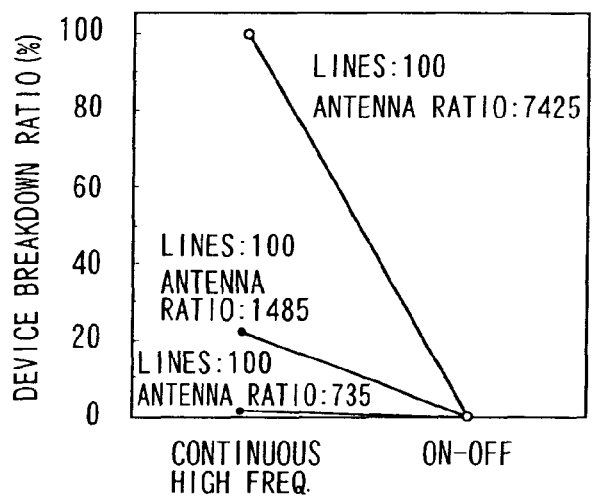
FIG. 7 is a graph showing a breakdown ratio of the gate oxide film.
Figure 24:
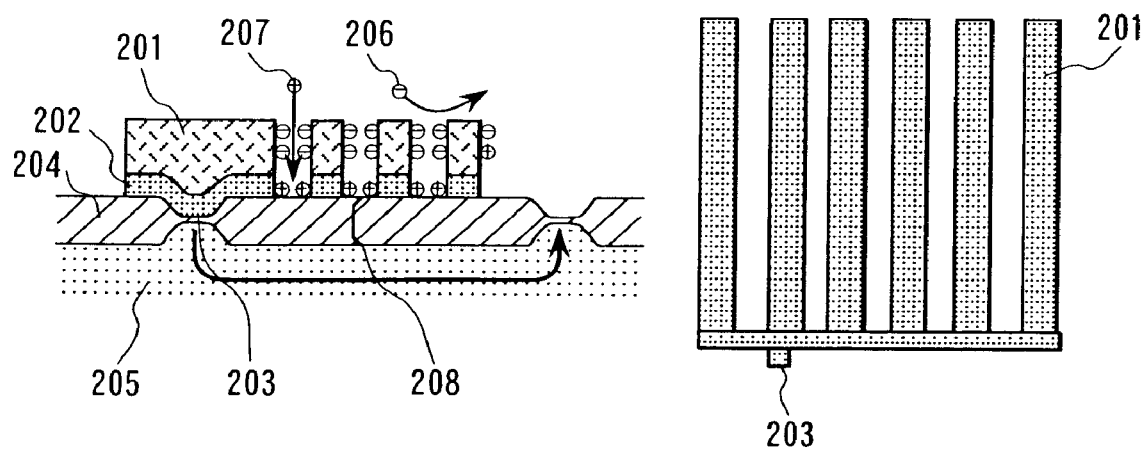
FIGS. 24(1), 24(2) are diagrams which show a cross-section of a specimen for explaining the electron shading phenomenon occurring in the prior art surface processing.

Now, with reference to FIG. 7, a result of measurements of the insulation breakdown ratio of the gate oxide film 203 in the device of FIG. 24 provided by etching for its appraisal is shown. An etching gas is a mixed gas comprising $Cl_2$ (80 sccm) and $BCl_3$(20 sccm), and its pressure was set at 1 Pa. The output of the high frequency voltage source 109 was set at 700 W. The temperature of the electrode was set at 40° C. The frequency of the high frequency voltage source 109 was 800 kHz, and its continuous output power was set at 70 W. During the on-off time, its peak power was 350 W, its repetitive frequency was 2 kHz, and its duty ratio was 20%. The net power which is a product of the peak power and the duty ratio was 70 W, and its on-time was 100 μs. Under these conditions, the speeds of etching of aluminum, poly-Si or resist become equivalent between a continuous high frequency voltage and on-off applications. In the device of FIG. 24, the gate oxide film 203 has a thickness of 4 n, the poly Si layer 202 has a thickness of 0.2 nm, the resist has a thickness of 1 μm, and the width of the line and space is set at 0.5 μm, respectively. Parameters in FIG. 7 are the number of lines and the antenna ratio (space portion area/gate oxide film area). Under any conditions, the breakdown ratio of the device can be reduced to 0% by turning the bias on and off, thereby proving the advantage according to the invention.

Figure 8:
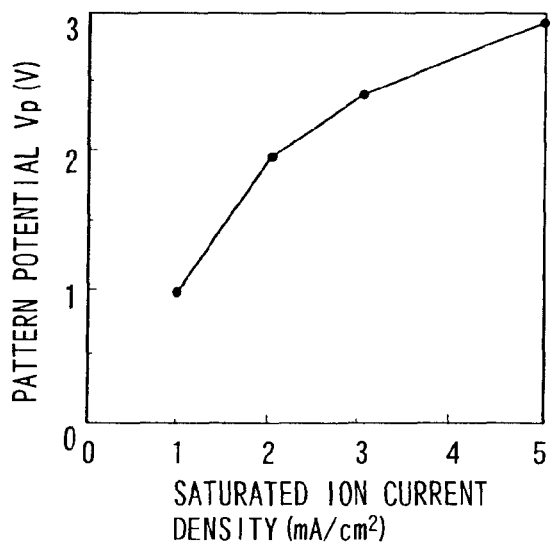
FIG. 8 is a graph showing a relationship between saturated ion currents and pattern potentials.

Now, the dependency of the line and space pattern potentials of the device in the state of FIG. 3(2) for various parameters will be described. When the high frequency voltage is turned on and off, although the pattern potential is caused to oscillate as indicated in FIG. 6, a pattern potential to be described below shows a peak value of the voltage when the voltage is stabilized. The following values are examples of numerical computation obtained by assuming that the thickness of the insulation underlayer film is 100 nm, and various etching conditions can be set in reference to these values as a yardstick. FIG. 8 shows a relationship between the values of saturated ion currents from plasma and the pattern potentials under conditions wherein the on-off repetition frequency is 2 kHz, the duty ratio is 20%, and the voltage amplitude at the on-time is 1500 V. When the saturated ion current from the plasma increases, the pattern potential increases accordingly, thereby creating the likelihood that the gate oxide film will be damaged. It is apparent from FIG. 8 that when the saturation ion current is set to be smaller than 5 $mA/cm^2$, the pattern potential drops less than 3 V, thereby suppressing the breakdown of the gate. In order to reduce the saturation ion current density, the power of the electromagnetic waves for generating the plasma may be decreased to obtain this effect.

In the device of FIG. 1, when its microwave power is decreased to less than 1500 W, its saturation ion current density becomes less than 5 $mA/cm^2$. Because the volume of the space for generating plasma in the etching apparatus of FIG. 1 (a space between the bottom surface of inlet window 103 and the upper surface of specimen table 108) is 15000 cc, the microwave power per cc of volume will be appropriate if set to be 0.1 W/cc or less. Even if the volume of the plasma generation space or the type of etching apparatus is changed, there will be no problem if the ratio between its plasma generation supply power and the volume of the plasma generation space is set at 0.1 W/cc or less.

Figure 9:
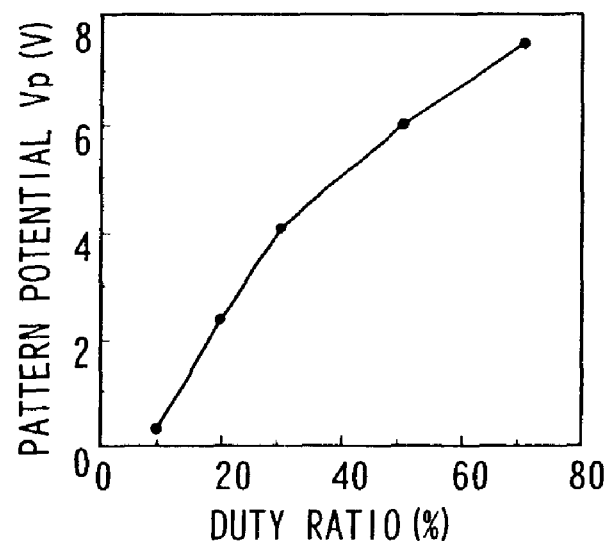
FIG. 9 is a graph showing a relationship between duty ratios and pattern potentials.

FIG. 9 shows an example of the pattern potentials produced when the repetitive frequency was set at 2 kHz constant and its duty ratio was varied. Pattern potentials can be reduced to less than 6 V at 50% or less of the duty ratio.

Figure 10:
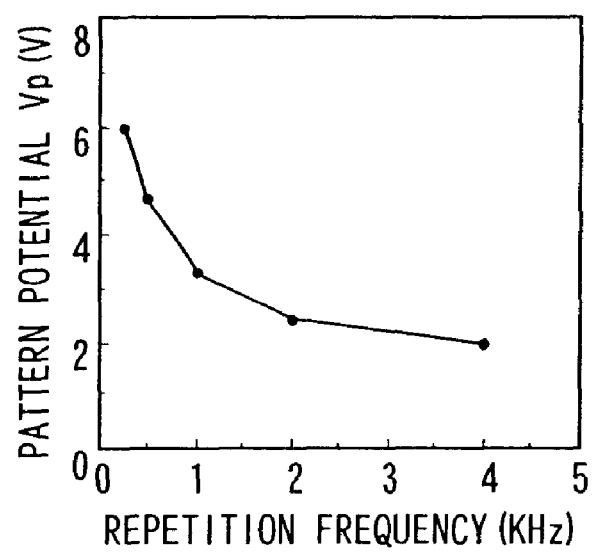
FIG. 10 is a graph showing a relationship between repetition frequencies and pattern potentials.

FIG. 10 shows an example of the pattern potentials produced when the duty ratio was set at 20% constant, and the repetitive frequency is varied. The pattern potentials can be reduced to less than 6 V when its repetitive frequency is set at more than 250 Hz.

Figure 11:
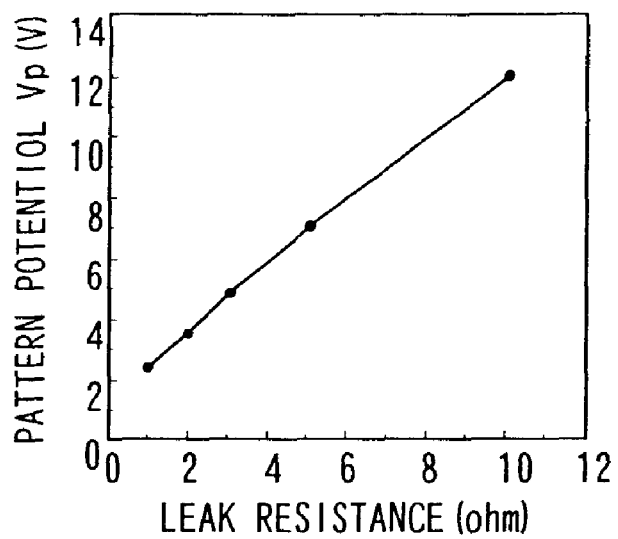
FIG. 11 is a graph showing a relationship between leak resistance and pattern potentials.

FIG. 11 shows a relationship between the leakage resistance of the pattern and the pattern potentials. The leakage resistance of the pattern is a neutralization phenomenon of positive charges accumulated in the pattern with electrons injected via a surface conduction of the resist, a leakage resistance of the oxide film or from the plasma, which is defined as a total sum of resistance. The smaller this value is, the faster the pattern potential is discharged, thereby reducing the potential accordingly. By designing the device or setting the etching conditions such that this value corresponds to 4 $ohm/m^2$ or less, its pattern potential will become 6 V or less.

Figure 12:
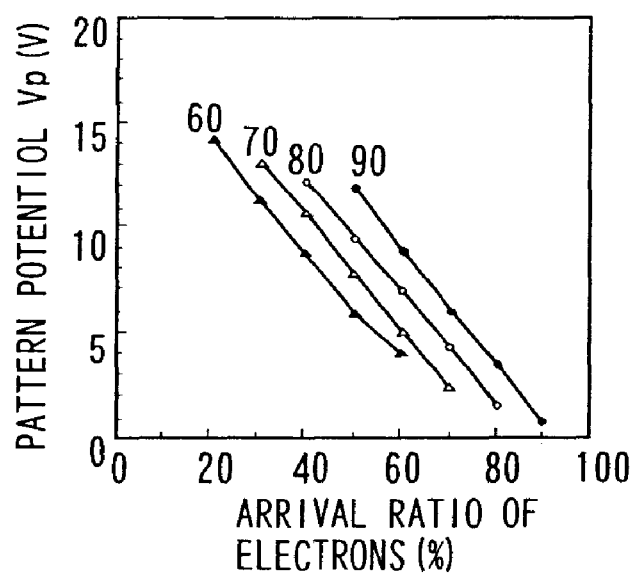
FIG. 12 is a graph showing a relationship between arrival ratios of electrons to the bottom of the groove and pattern potentials.

In normal processing, no specific setting is required, however, in such a case where, for example, lines and space having a very high aspect ratio must be processed, such a specific setting will be required. In the design of the device, a part of the pattern may be connected via a material having a low electrical resistance to a silicon wafer of the substrate, and then, after the processing of the lines and space, the part thereof is separated. Further, depending on its etching conditions, in order to lower the resistance at the surface of the resist, a carbon atom containing a gas such as CO2, CO, CF4, CH4 may be mixed so as to accumulate carbons on the surface of the resist. FIG. 12 shows examples of computation of electron arrival ratios to the bottom of the groove relative to the pattern potentials. Here, ion arrival ratios to the bottom of the groove are taken as parameters. Respective arrival ratios of ions and electrons to the bottom of the groove depend on the aspect ratio and etching conditions.

Next, a type of gas to be used in etching will be described. This embodiment of the invention is suitable for use in the processing of lines and space having a high aspect ratio. Such lines and space correspond mainly to a portion of a gate electrode or a metal wiring to be connected to the gate electrode in a transistor. The gate electrode is made of poly Si, an alloy of poly Si and a metal, a high melting point metal such as tungsten, or a multi-layered film using such materials. Gases suitable for etching these materials include chlorine, HBr, mixture gases of chlorine and oxygen, HBr and oxygen, or chlorine, HBr and oxygen. Namely, this embodiment of the invention is preferably used in combination with these gases effectively to demonstrate the advantages thereof.

The present embodiment of the invention has been described by way of example wherein the width of a line and a space is 0.5 μm, respectively, however, it is not limited thereto, and it can be applied to processing of any fine patterns in which the lines and space have a width which is less than 1 μm, and an aspect ratio which is more than 1 with the same advantages as above ensured.

[Embodiment 2]

Figure 13:
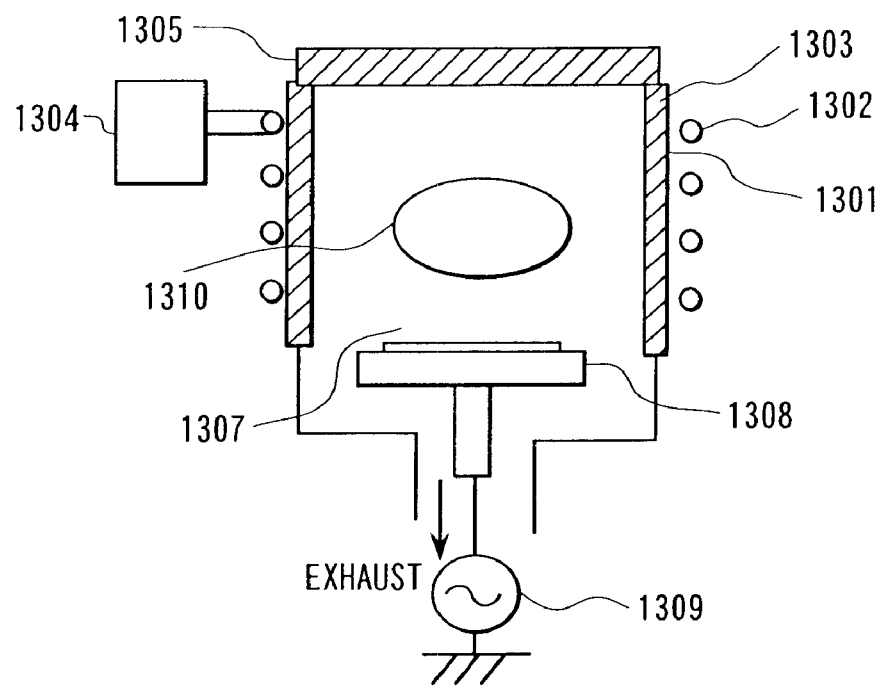
FIG. 13 is a diagram of a surface processing apparatus according to another embodiment of the invention.

FIG. 13 shows a construction of an apparatus according to another embodiment of the invention, wherein a plasma is generated by induction coupling using so-called radio wave band frequencies in a range from several hundred kHz to several tens MHz (referred to as rf hereinafter). Vacuum chamber 1303 is made of a material such as alumina, quartz or the like which allows electromagnetic waves to pass. An electromagnetic coil 1302 is wound around the chamber for generating plasma 1310. An rf power supply 1304 is connected to the coil. A specimen table 1308 is placed within the vacuum chamber 1301, on which a specimen 1307 is mounted. A high frequency voltage supply 1309 is connected to the table. An upper cover 1305 is attached to vacuum chamber 1301, which may be provided integral therewith.

In this apparatus according to the second embodiment of the invention, if an increase in the pattern potentials is suppressed by repetitively turning on and off the high frequency voltage supply 1309 in the same manner as described above, breakdown of the gate oxide film can be prevented.

In reference to FIG. 13, the electromagnetic coil 1302 may be placed over the upper cover 1305 to the same effect.

[Embodiment 3]

Figure 14:
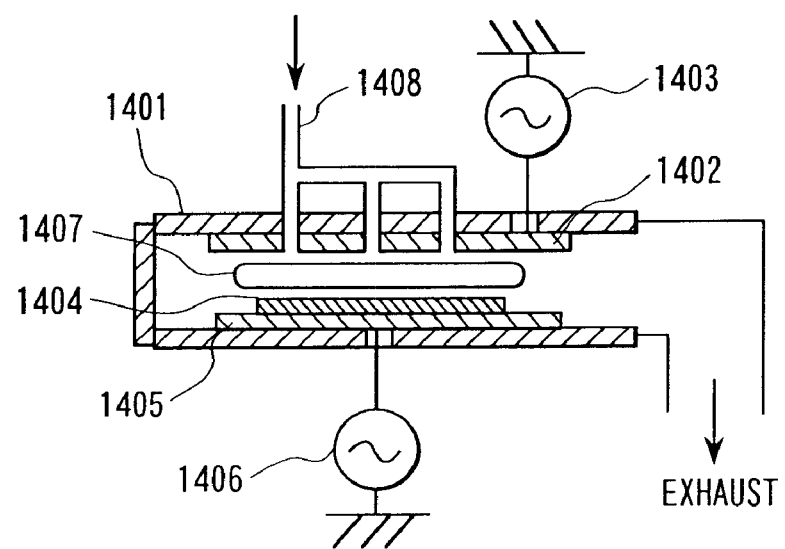
FIG. 14 is a diagram of a surface processing apparatus according to still another embodiment of the invention.

FIG. 14 shows a construction of an apparatus according to still another embodiment of the invention, wherein a plasma is generated by capacitance coupling of rf power. In its vacuum chamber 1401, two sheets of electrodes 1402 and 1405 are placed in parallel. An rf power supply 1403 and a high frequency voltage power supply 1406 are connected to these electrodes, respectively. A specimen 1404 is mounted on the electrode 1405 which serves also as a specimen table. A gas is introduced into the chamber from an inlet pipe 1408 through openings provided in the electrode 1404 opposite to the specimen. A plasma 1407 is generated in a space between the two sheets of electrodes.

In this apparatus according to the invention, by suppressing an increase in the pattern potentials by repetitively turning on and off the high frequency voltage supply 1406 in the same manner as described above, breakdown of the gate oxide film can be prevented.

According to the invention as described heretofore, the breakdown of insulation of the gate oxide film can be prevented by suppressing an increase in the pattern potentials.

[Embodiment 4]

Figure 15:
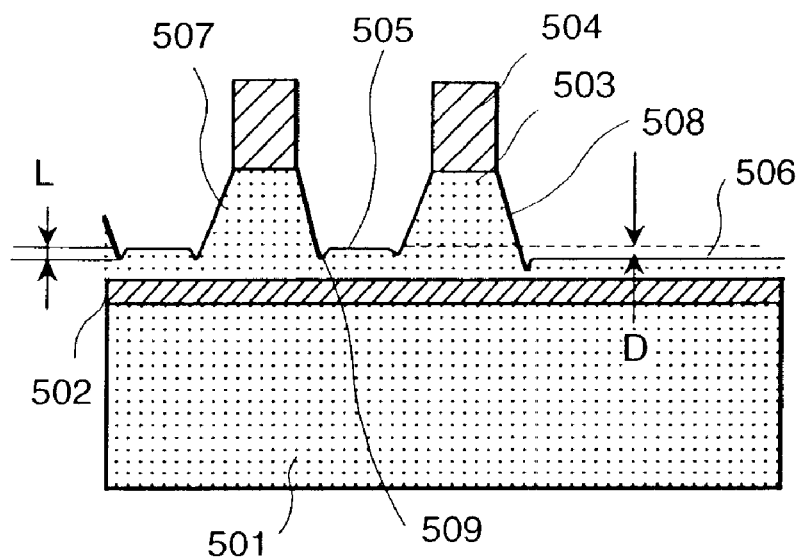
FIG. 15 and FIG. 16 are the cross-sectional views of a target wafer etched by the apparatus of FIG. 1.
Figure 16:
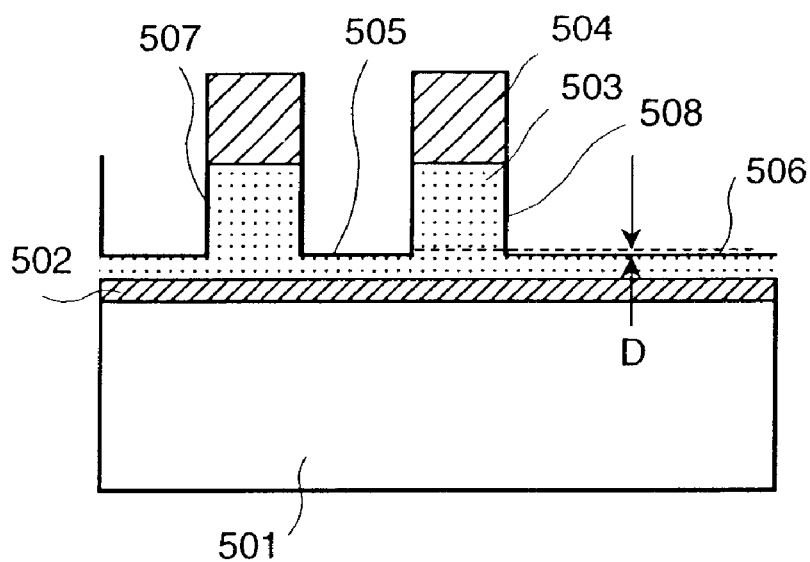

Referring to FIG. 15 and FIG. 16, a fourth embodiment of the present invention will be explained below.

FIG. 15 and FIG. 16 show the cross-sectional views of a fine pattern consisting of lines and spaces which was etched by this apparatus under the following conditions.

(a) Etching gas: A mixture of chlorine gas (72 sccm) and oxygen gas (8 sccm)
(b) Pressure in the vacuum chamber 14: 0.4 Pa
(c) Output of the microwave power supply 101: 400 W
(d) Frequency of the bias power supply 109: 800 kHz
(e) Structure of the target: Silicon substrate 201, an oxide film as gate 202 of 4 nm thickness, a polycrystalline silicone layer 203 of 300 nm, and a resist layer 204 of 1 μm thickness.
(f) Line and space widths: 0.4 μm respectively FIG. 15 shows a sectional view of the target etched by a continuous 60 W output from the bias power supply 109 (hereinafter called "continuous bias") and FIG. 16 shows a sectional view of the target etched under conditions of intermittent on/off control of the high-frequency voltage (hereinafter called "continuous bias"), a peak output of 300 W, and a duty ratio (rate of ON-time period in one cycle) of 20%. The on/off frequency of the high-frequency voltage is 1 kHz. Under the above conditions, the speed of etching of the polycrystalline silicone layer is about 250 nm/minute and the ratio of selectivity of the oxide film is about 20.

FIG. 15 shows a cross-sectional view of the polycrystalline silicone layer 503 which was etched halfway. As seen from FIG. 15, etching by a continuous bias voltage makes the etched grooves non-uniform in the polycrystalline silicone layer. Namely, the walls of the etched grooves are not perpendicular to the bottom of the grooves and the wall 508 of a wider etched groove is less perpendicular to the groove bottom than the wall 507 of a narrower etched groove. (Shape micro-loading) Further, the etched grooves have some fine trenches 509 on their bottoms. In contrast, on/off-controlled etching makes the etched grooves sharp and uniform in the polycrystalline silicone layer (in which the wall of the etched groove is exactly perpendicular to the groove bottom) and reduces the shaped micro-loading. At the same time, this method reduces subtrenches on bottom of the groove and a difference D between the etching depth 505 in a narrow area (area between lines) and the etching depth 506 in a wide area (a space area).

Subtrenches 509 are formed on groove bottoms by charged ions which are reflected on the non-perpendicular groove walls. Therefore, the subtrenches can be eliminated when the groove walls are perpendicular to the bottom. Generally, the perpendicularity of etched groove walls to etched groove bottoms becomes higher as the ion energy becomes greater. The ion energy is approximately proportional to the amplitude (called Vpp) of the bias voltage. For example, the bias voltage Vpp is 320 V for a continuous 60 W output from the bias power supply or 1410 V for on/off-controlled 300 W bias-peak power.

Accordingly, the on/off-controlled etching has greater ion energy and good perpendicularity as shown in FIG. 16. It is also true that the perpendicularity in the continuous bias etching is improved by increasing the bias voltage Vpp, however the selectivity ratio of only silicon to the oxide film becomes lower because etching of the oxide film becomes faster as Vpp becomes higher. This means that the continuous bias etching at a high bias voltage Vpp is not good for the processing of substrates having a thin oxide film (e.g. etching of gate electrodes of transistors). The on/off-controlled etching intermittently turns off a high-frequency voltage during acceleration of charged ions to reduce the number of high-energy ions. With this, the on/off-controlled etching method can increase the perpendicularity of etched groove walls to etched groove bottoms without reducing the layer selectivity ratio.

Other gases fit for etching polycrystalline silicone layers are HBr and SF6. A typical etching condition involves the use of a mixture of HBr gas (100 cc) and oxygen gas (5 cc), a vacuum pressure of 0.2 Pa, and a 400 W output of the microwave power supply 101. Mixtures of chlorine, HBr, and oxygen gases are also used frequently. Another typical etching condition is a mixture of a chlorine gas (20 cc), a HBr gas (90 cc), and an oxygen gas (3 cc) at a vacuum pressure of 0.4 Pa.

[Embodiment 5]

Figure 18:
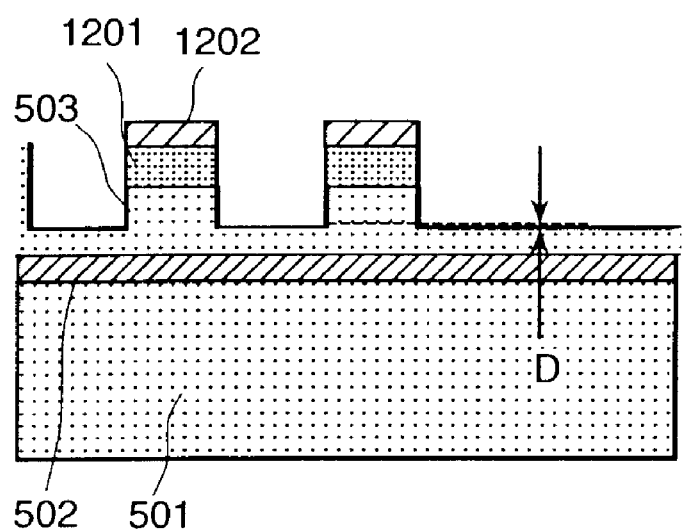

This embodiment involves a result of applying the surface treating method of the present invention to other target materials. As shown in FIG. 18, this target wafer consists of silicone substrate 301, an oxide layer 302 of 4 nm thickness, a polycrystalline silicone layer 303 of 300 nm thickness, and a tungsten silicide (WSi) layer 304 of 80 nm thickness in that order from the bottom. This wafer has a patterned silicone nitride layer 305 (as a mask) on the top of it.

The etching conditions are as follows.
(a) Etching gas: a mixture of a chlorine gas (185 sccm) and an oxygen gas (15 sccm)
(b) Vacuum pressure: 0.8 Pa
(c) Output of the microwave power supply 101: 400 W
(d) Frequency of high-frequency power supply: 800 kHz.

Figure 17:
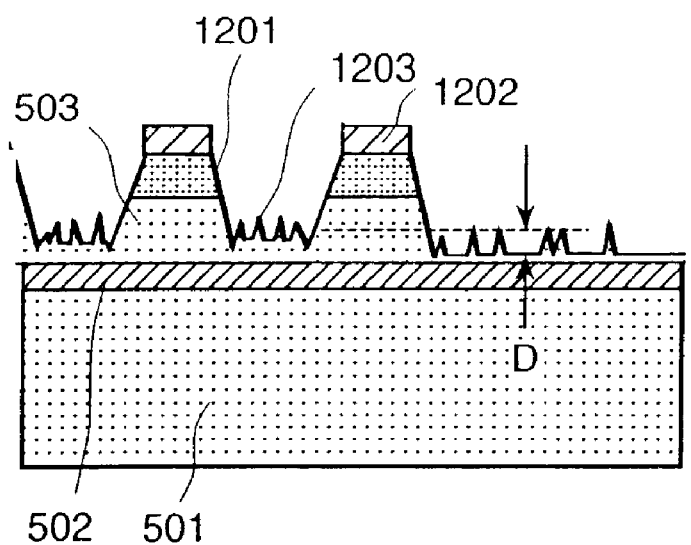
FIG. 17 and FIG. 18 are the cross-sectional views of a target wafer etched by the apparatus of FIG. 1.

FIG. 17 and FIG. 18 are cross-sectional views of the polycrystalline silicone layer which was etched halfway. FIG. 17 shows the sectional view of the target etched by continuous 60 W bias power (at Vpp of about 370 V) and FIG. 18 shows the sectional view of the target etched under conditions of intermittent on/off control of a high-frequency voltage, a peak output of 300 W (at Vpp of about 1450 V), and a duty ratio (rate of ON-time period in one cycle) of 20%. Under the above conditions, the speed of etching the polycrystalline silicone layer is about 350 nm/minute and the ratio of selectivity of the oxide film is about 25. Also, in case of this etching target, the continuous bias etching results in dull perpendicularity and great micro-loading. In contrast, the on/off-controlled etching results in high perpendicularity of etched groove walls 1201 to etched groove bottoms. Further, in the continuous bias etching method, the etched polycrystalline silicone surfaces had some upright needle-like projections 1203 on them. These projections are assumed to be caused by impurities on the boundary between the polycrystalline silicone layer 503 and the tungsten silicide. (The impurities may work as a mask.) These are unwanted areas which are left un-etched. The on/off-controlled etching can also eliminate such needle-like projections.

[Embodiment 6]

This embodiment involves a result of applying the surface treating method of the present invention to a multi-layer target containing a metallic layer and a semiconductor layer. Various developments have been made for faster operations of semiconductor elements. One of such developments is to use a metal whose resistance is lower than that of the polycrystalline silicone layer for a gate electrode of the transistor.

Figure 19:
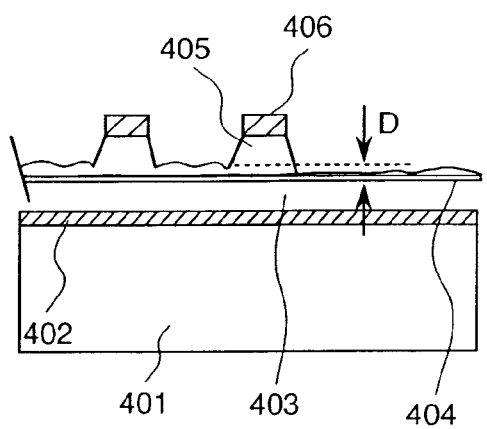
FIGS. 19(1) and 19(2) are cross-sectional views of a target wafer etched by the apparatus of FIG. 1.
Figure 19:
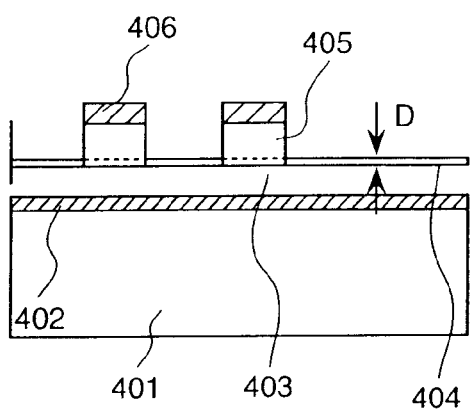

As shown in FIG. 19(1) and FIG. 19(2), this target wafer consists of a silicone substrate 401, an oxide layer 402 deposited on the substrate, a polycrystalline silicone layer 403, and a tungsten silicide (WSi) layer 404, and a tungsten layer in that order from the bottom. This wafer has a patterned silicone nitride layer 406 (as a mask) on the top of it.

The etching conditions are as follows.
(a) Etching gas: a mixture of a chlorine gas (38 sccm) and an oxygen gas (12 sccm)
(b) Vacuum pressure: 0.2 Pa
(c) Output of the microwave power supply: 500 W
(d) Target temperature: 70° C.

FIG. 19(1) is a sectional view of a target etched by continuous 140 W bias power (at Vpp of about 890 V) and FIG. 19(2) is a sectional view of a target etched under conditions of intermittent on/off control of a high-frequency voltage, a peak output of 700 W (at Vpp of about 1720 V), and a duty ratio of 20%. This target is very hard to etch because the vapor pressure of the tungsten chloride is very low. In addition to this, the continuous bias etching on this target results in dull perpendicularity and great micro-loading. These problems greatly affect the etching status of the ground (polycrystalline silicone layer). In contrast, the on/off-controlled etching results in higher perpendicularity of etched groove walls and smoother etched bottoms than those made by the continuous bias etching.

Referring to FIG. 19(1), the target wafer has a polycrystalline silicone layer 403 and a tungsten silicide layer 404 (as buffering layers) between the tungsten layer 405 and the oxide film 402. However, for faster operation, target wafers containing only a tungsten layer have been studied. The surface treating method of the present invention is also effective for this type of semiconductor element.

Although the above embodiment uses tungsten, other metallic materials such as molybdenum, nickel, cobalt, and titanium are available. These metals have high melting points and can endure high temperature processing. The combinations of the nitrides of these metals can be used as barrier layers. The on/off-controlled etching of the present invention using a gas (e.g. oxygen gas) which promotes etching of metals is also effective to form smooth etching surfaces with high wall-to-bottom perpendicularity. Further, the mask material can be ordinary organic photo-resist. However, carbon in the photo resist may promote etching of the oxide layer and reduce the selectivity ratio. To increase the selectivity ratio, the mask materials should preferably be inorganic such as silicon oxide or silicone nitride.

Gases including fluorine atoms such as SF6 and CF4 are also available as gases for etching tungsten materials. Also, in this etching gas atmosphere, the method of etching by intermittently turning on and off the high-frequency voltage can form smooth etching surfaces. An oxygen gas added to the etching gas can promote etching of tungsten and make this method more effective. Further, a gas containing fluorine atoms increases the etching speed comparatively even when the target temperature is low. The temperature of the target should be 20° C. or lower as the high temperature promotes fluorine atoms to etch the walls of the grooves in the polycrystalline silicone layer.

[Embodiment 7]

Figure 20:
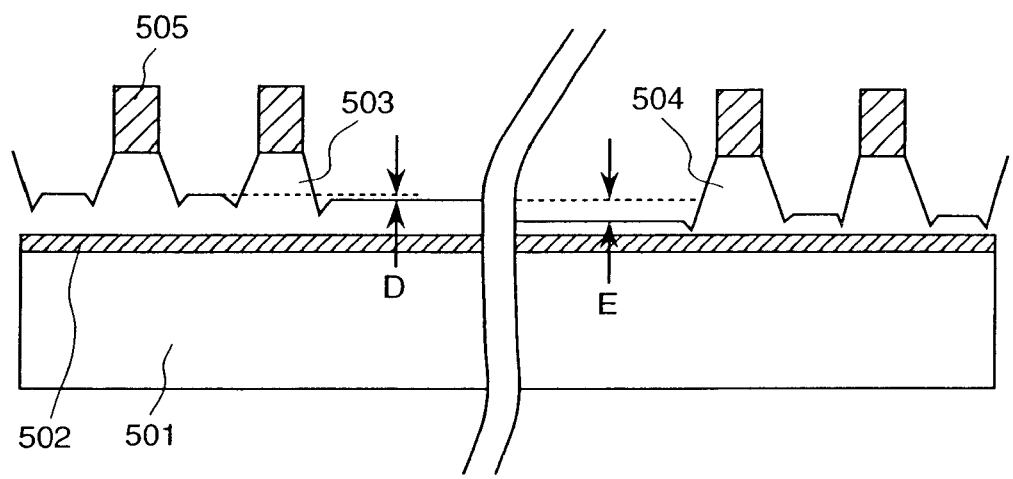
FIGS. 20(1) and 20(2) are cross-sectional views of a target wafer etched by the apparatus of FIG. 1.
Figure 20:
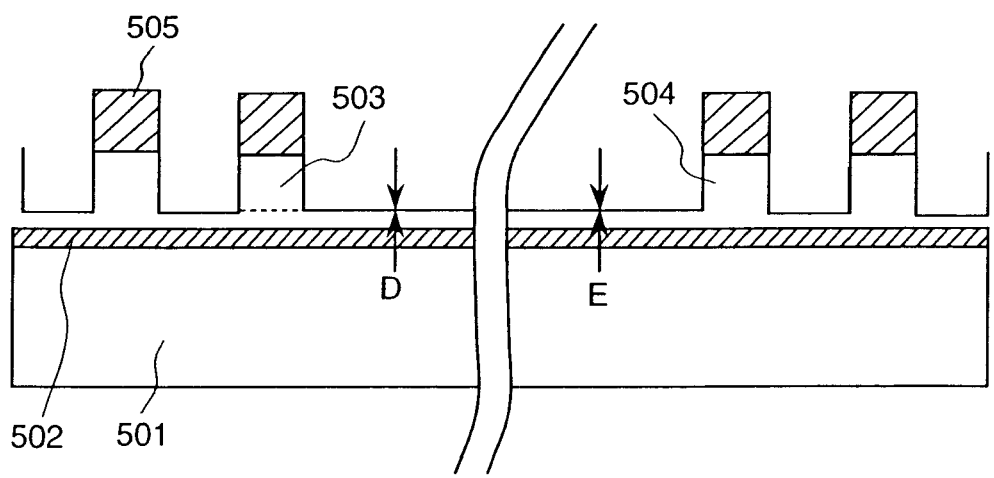

This embodiment involves a result of applying the surface treating method of the present invention to a target wafer having polycrystalline silicone electrode layers of different conductivities for faster semiconductor operation (which is called a dual-gate wafer). FIG. 20(1) is a sectional view of the etched target. The target wafer has a silicone substrate 501, an oxide layer 502 deposited on the substrate, a p-type polycrystalline silicone layer 503, n-type polycrystalline silicone layer 504, and a resist layer 505 on the top of these layers.

The etching conditions are as follows.
(a) Etching gas: a mixture of a chlorine gas (55 sccm) and an oxygen gas (4 sccm)
(b) Vacuum pressure: 0.4 Pa
(c) Output of the microwave power supply: 400 W FIG. 20(1) is sectional view of a target etched by a continuous 35 W bias etching and FIG. 20(2) a sectional view of a target etched under conditions of intermittent on/off control of a high-frequency voltage, a peak output of 175 W and a duty ratio of 20%. The etching speed is dependent upon the conductivity of a semiconductor material to be etched. Namely, the etching speed on the n-type polycrystalline silicone layer is greater and the etching speed on the p-type polycrystalline silicone layer is smaller. Therefore, this etching speed difference causes etching depth differences E even in wide spaces. Etching is also affected by pattern shapes. The wall-to-bottom perpendicularity of the p-type polycrystalline silicone layer is worse than that of the n-type polycrystalline silicone layer. Therefore, the etching becomes harder. The on/off-controlled etching can also eliminate this problem. The difference between the p- and n-type polycrystalline silicone layers may be due to the difference between their chemical reactivity with halogen radicals such as chlorine. The p-type polycrystalline silicone is less reactive with halogen atoms, which reduces the etching speed and makes the etched lines bolder. In contrast, the areas to which ion energy is applied have many physical spatters and cause no difference between the—and p-polycrystalline silicone layers. Therefore, this difference between the—and p-polycrystalline silicone layers becomes smaller in the on/off-controlled etching which uses high ion energy.

[Embodiment 8]

Figure 21:
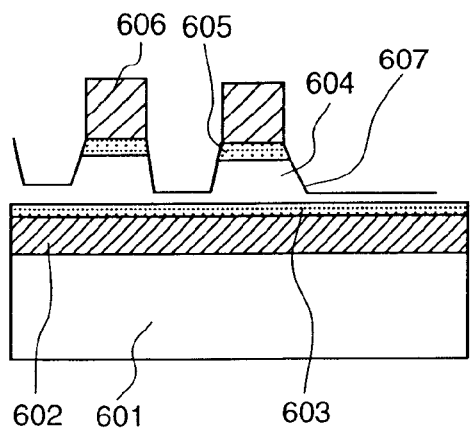
FIGS. 21(1) and 21(2) are cross-sectional view of a target wafer etched by the apparatus of FIG. 1.
Figure 21:
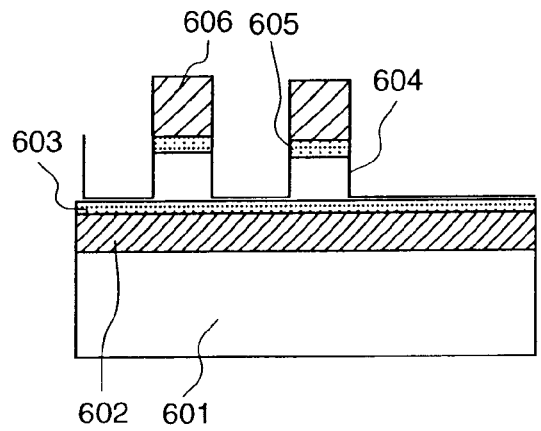

This embodiment involves a result of applying the surface treating method of the present invention to a target wafer containing a metallic layer such as aluminum. As shown in FIG. 21(1), this target wafer consists of a silicone substrate 601, an oxide layer 602 of 300 nm thickness deposited on the substrate, a titanium nitride TiN layer 603 of 100 nm thickness, an aluminum layer 604 of 400 nm thickness, a titanium nitride TiN layer 605 of 75 nm thickness, and a resist mask layer 606 of 1 μm thickness on the top of these layers. The pattern lines and spaces are 0.4 μm thick.

The etching conditions are as follows.

(a) Etching gas: a mixture of a chlorine gas (80 sccm) and a BCl3 gas (20 sccm)

(b) Vacuum pressure: 1.0 Pa (c) Output of the microwave power supply 101: 700 W (d) Electrode temperature: 40° C.

(e) Frequency of the high-frequency voltage supply 109: 800 kHz (f) ON/OFF repetition frequency: 2 kHz FIG. 21(1) is a sectional view of a target etched by a continuous 70 W bias etching and FIG. 21(2) is a sectional view of a target etched under conditions of intermittent on/off control of a high-frequency voltage, a peak output of 350 W and a duty ratio of 20%. This target wafer has a great shaped micro-loading and the perpendicularity of the wall 607 facing a rather wide space is the worse in continuous bias etching. This problem can be eliminated by the on/off-controlled etching.

[Embodiment 9]

A relationship between the magnitude of ion energy required to improve the wall-to-bottom perpendicularity and the magnitude of the high-frequency voltage will be explained. The absolute value of ion energy to form etched walls perpendicular to etched bottoms cannot be determined as it depends upon wafer materials and etching conditions. Judging from many experiments, the wall-to-bottom perpendicularity starts to be improved from about 1.2 times the ion energy for continuous bias etching and becomes optimum at about 1.5 times the ion energy for continuous bias etching. Therefore, to get the optimum wall-to-bottom perpendicularity, the ion energy should increased to 1.2 times as strong as the ion energy for continuous bias etching and the number of ions of the energy should be reduced down to 80%. In other words, the on/off-controlled etching at a duty ratio of 80% is recommended. When the ion energy is 1.5 times as strong as the ion energy for continuous bias etching, a duty ratio of 67% is recommended.

As the ion energy substantially has a great effect upon the etching results, the ion energy should be increased to improve the wall-to-bottom perpendicularity. The approximate ion energy whose measurement takes much time can be estimated from the amplitude Vpp of the bias voltage. When a high-frequency voltage is applied to the target table through the plasma, a direct current potential (hereinafter called Vdc) is generated between the ground (generally a conductor wall) and an electrode to cause a current to flow between them. The ion particles are accelerated by a magnetic field generated by a combination of this potential Vdc and a high-frequency voltage which varies as the time goes by. The maximum energy given to the ion particles varies depending upon whether it follows the hourly change of the high-frequency voltage.

The density of plasma used in general etching processes is $10^{10}$ ions per cubic centimeter or more. At this plasma density, ions can get to the target across the plasma sheath while the high-frequency voltage is negative (when the frequency of the high-frequency voltage is 15 MHz or less), that is, during the half cycle of the sine wave. As a result, Emax becomes approximately equal to the sum of Vdc and half of the amplitude of the voltage. From experiments, it is known that Emax is substantially equal to 70% to 80% of Vpp because of voltage drops in the electric circuit. If the frequency of the high-frequency voltage increases and ions cannot follow the change in the voltage, Emax gradually reaches Vdc. If the frequency is some ten MHz above 15 MHz (in the transient status), Emax is half of Vpp or more.

The recommended on/off repetition frequency is 100 Hz to 10 kHz. If the frequency goes lower, the advantages obtained by the on/off-controlled etching become smaller. On the contrary, if the on/off repetition frequency goes higher, the high-frequency voltage supply 109 may not be produced easily.

Next, an explanation will be given as to how much ion energy is required to attain high anisotropy. This condition is dependent upon etching materials and conditions. Therefore, a plurality of values can be expected and they can be used as a guide for bias on/off control. Let's assume that the degree of etching anisotropy is expressed by an angle (taper angle) of the etched wall of a line pattern and the ion energy E required to get a taper angle close to 90 degrees is calculated (by a theoretical formula described in Drive Process Symposium Drafts (Page 45), NEC Society 1997). In the theoretical formula, the taper angle is expressed by $$q = \arccos(R/dAF)$$

Wherein

R: A rate of deposition of reactants.

d (ion range): A depth affected by bombarded ions, which is expressed by d=0.01E (nm)

A (hot spot): An area affected by bombarded ions, which is expressed by $A=0.025E^{1/3}$ F: A frequency of collision of ions per unit area, which is calculated from the current density of ions applied to the target.

Figure 22:
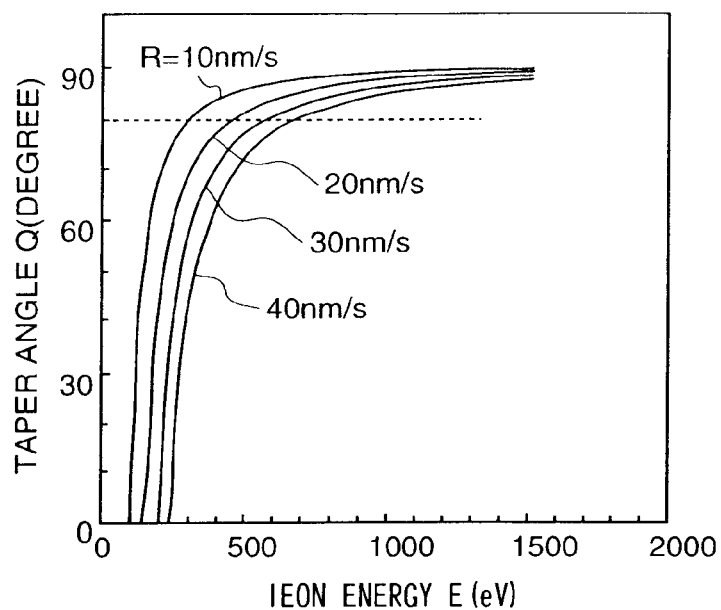
FIG. 22 is a graph showing the relationship between ion energy magnitudes and taper angles according to the surface treatment of the present invention.

FIG. 22 shows the relationship between the calculated magnitude of ion energy E and the taper angle q. To turn off a bias voltage for a preset time period means to reduce the number of accelerated ions, that is, to reduce the substantial ion current density by the duty ratio. FIG. 22 uses the deposition speed (rate) as a parameter, assuming that the ion current density is 1.4 mA/cm² and the duty ratio is 20%. The deposition speeds are assumed to be 10 nm to 40 nm although the speed is dependent upon substances to be etched and etching pressures. A small R value means that there is a small amount of deposits (or that the rate of ventilation is great) or that the reactants are hard to be deposited. On the contrary, a great R value means that there is a large amount of deposits or that the reactants are easily deposited. As seen from FIG. 22, the required ion energy (E) is 300 eV or more at R=10 nm/s or 600 eV or more at R 40 nm/s to get the taper angle of 80 degrees or more (which is in the tolerable range).

[Embodiment 10]

Next, the etching conditions will be explained. The aforesaid etching conditions are typical, although the present invention is effective also under other etching conditions having a different gas pressure, type, and plasma generation voltages. However, considering the etching speed and the selectivity ratio in addition to the above etching conditions, the recommended etching conditions should be as follows.

To etch a multi-layer target wafer mainly containing a polycrystalline silicone layer, a mixture of a chlorine gas and an oxygen gas is used. The flow rate of the chlorine gas should be 20 sccm through 1000 sccm and the rate of the oxygen gas in the mixture should be 0% to 50%. If the etching gas contains more oxygen gas, the speed of etching the polycrystalline silicone layer becomes drastically low. The vacuum pressure should be 0.1 Pa through 10 Pa. Similarly, when a mixture of chlorine, HBr, and oxygen gases is used, the flow rates of chlorine and HBr gases should respectively be 20 sccm through 1000 sccm and the rate of the oxygen gas in the mixture should be 0% to 50%.

Gases recommended for etching a target wafer containing a metallic wiring layer such as an aluminum layer are a chlorine gas, a mixture of chlorine and BCl3 gases, a mixture of chlorine and HCl gases, or a mixture of chlorine, HBr, and oxygen gases. The flow rates of chlorine and HCl gases should respectively be 20 sccm through 1000 sccm and the rate of the BCl3 gas in the mixture should be 0% to 50%. These etching gases or mixtures can contain methane gas (CH4) or a rare gas such as argon.

The density of plasma is dependent upon the power of the plasma generating power supply and is closely related to the etching speed. To get a practical etching speed, a power of 0.01 W/cc should be applied to the plasma generating space between the target table and the electrode. The power should be under 0.2 W/cc as too high plasma density may cause electrical damages on semiconductor elements.

Further the frequency of the high-frequency voltage supply to be applied to the target should be 100 KHz to 100 MHz. The on/off repetition frequency should be under 10 kHz. If this frequency is under 100 Hz, the on-off intervals are too long and the resulting etched walls are not smooth. On the contrary, if the on/off repetition frequency is too high, the high-frequency voltage supply may not be produced easily. The on/off duty ratio should be 5% through 80%. If the duty ratio is smaller than 5%, the etching speed may be unstable. If the duty ratio is greater than 80%, the on/off-controlled etching may be close to the continuous bias etching. The high-frequency power to be applied to the target should be 20 W through 500 W at a frequency of 100 kHz through 800 kHz, 40 W through 1 kW at a frequency of 800 kHz through 5 MHz, and 80 W through 2 kW at a frequency of 5 MHz through 100 MHz, although the power greatly depends upon the frequency of the high-frequency voltage supply. The power for the on/off-controlled etching is the product of the peak power and the duty ratio.

The present invention is more effective to etching of fine patterns containing lines and spaces of 0.5 µm or less and to etching of gate electrodes whose ground is 5 nm or less.

The present invention can also be used for a step-etching which changes etching conditions while etching is in progress. In this case, for example, the on/off-controlled etching is first performed to etch the polycrystalline silicone layer (in the main etching process). After the oxide film under the polycrystalline silicone layer is exposed, parts which are left un-etched are etched off using a mixture of HBr and oxygen gases (in the over-etching process). As the surface treating method of the present invention also has an effect to make the etching speed constant, the method can reduce the electron shading damage due to the directional difference between electrons and ions in the plasma during etching. To eliminate this damage without reducing the selectivity ratio, the on/off-controlled etching is performed in the first step and the amplitude of the high-frequency voltage is set from just before the end of etching of the current layer.

Although the embodiments of the present invention have been explained using methods of intermittently turning on and off the high-frequency power supply, the output of the high-frequency power supply can be reduced down to complete zero during the ON time period but need not always be zero. In other words, the output of the high-frequency power supply can be reduced down so long as the energy acting on the ions does not affect etching in the OFF time period. Accordingly, the OFF time period contains a little output.

Figure 23:
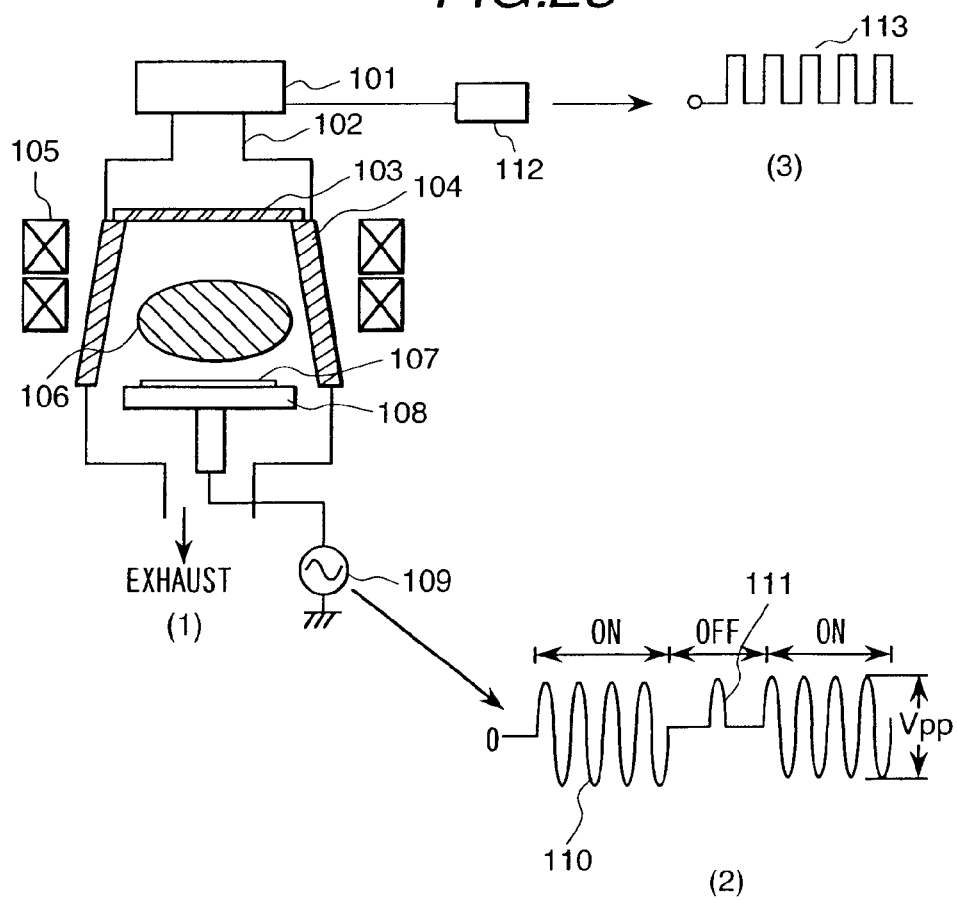
FIG. 23 is a diagram of a plasma etching apparatus representing another embodiment of the present invention.

Although the aforesaid embodiments of the present invention provide for control to intermittently turn on and off the output of the high-frequency power supply, that is, involve a time modulation of a bias voltage, it can be used in combination with periodic plasma generation, as shown in FIG. 23. In this system, a control unit 112 is connected to the microwave power supply 101 to change the microwave output into a pulse-like output 113. This control unit can make the microwave power supply 101 output a positive pulsating voltage 111 in the OFF time period in the on/off control of the high-frequency output. FIG. 1 and FIG. 23 use identical symbols for units which behave the same. The present invention does not limit the plasma generating to a microwave generating means. This system outputs a pulsating voltage or overlaps the output with the output from the other power supply during the OFF time period, by which electrons can be attracted to the surface to be etched while the pulsating voltage is applied. This increases the effect of charge-up cancellation. However, if the area to be etched has a very fine pattern of high aspect ratio, this charge-up cancellation effect is canceled because the electrons are repelled by electrons charged on the walls at the entrance of the top of the pattern and cannot go further to the bottom. Such a problem can be eliminated by reducing the temperature of plasma electrons to suppress the free movement of the electrons, reducing the movement of the electrons attracted by a positive voltage along the horizontal direction, reducing the charge of electrons to the walls and thus enabling the electrons to go further to the bottom of the pattern. With this, the charge-up cancellation effect is retained. The temperature of plasma electrons can be reduced by periodically generating the plasma. Accordingly, a combination of periodic plasma generation, intermittent on/off control of the high-frequency power supply, and application of a pulsating voltage during the OFF time period is effective to prevent charge-up of fine patterns.

The surface treating method of the present invention has an effect to increase the anisotropy and to prevent reduction of the selectivity ratio in fine pattern etching.

Further, the surface treating method of the present invention can increase the wall-to-bottom perpendicularity and reduce the shape micro-loading in surface treatment.

Furthermore, the surface treating method of the present invention can reduce irregular pattern lines and the shape micro-loading simultaneously.

What is claimed is:

1. A plasma processing method for etching a sample having a gate oxide film, comprising the steps of:

generating a plasma in a vacuum chamber using electromagnetic waves without interruption of the plasma during etching of the sample by at least continuously supplying power to enable generation of the plasma during etching of the sample;

applying an if bias power to the sample;

turning off the if bias power before a charged voltage of the sample reaches a breakdown voltage of the gate oxide film;

turning on the rf bias power after the charged voltage of the sample has substantially dropped; and repeating said turning on and off of the if bias power to process the sample;

wherein the off-time is set at least longer than the on-time.

2. A plasma processing method according to claim 1, wherein the off-time is set at a value which is at least twice the on-time.

3. A plasma processing method according to claim 2, wherein the on-time of the if bias power to be applied to the sample is set at no greater than 30 to 60 $\mu$s.

4. A plasma processing method according to claim 1, wherein the on-time of the if bias power to be applied to the sample is set at no greater than 60 to 120 $\mu$s.

* * * * *